United States Patent [19]

Malka et al.

[11] Patent Number: 4,937,846

[45] Date of Patent: Jun. 26, 1990

[54] FREQUENCY COUNTER-LOCKED-LOOP APPARATUS FOR CONTROLLING DIGITALLY PROGRAMMABLE OSCILLATORS

[75] Inventors: Jacob H. Malka, Fair Lawn, N.J.; Mordechai Friedlander, Chestnut Ridge, N.Y.

[73] Assignee: Allied Signal Inc., Morris Township, Morris County, N.J.

[21] Appl. No.: 226,510

[22] Filed: Aug. 1, 1988

[51] Int. Cl.$^5$ .................... H03L 7/18; H03K 3/027
[52] U.S. Cl. ............................ 377/39; 377/54; 377/55; 328/55; 328/61; 331/1 A
[58] Field of Search ................ 328/55, 61; 377/39, 377/54, 55; 331/1 A

[56] References Cited

U.S. PATENT DOCUMENTS

| | | | |
|---|---|---|---|
| 3,657,658 | 4/1972 | Kubo | 328/61 |
| 3,660,842 | 5/1972 | Ballantyne | 377/39 |
| 3,670,151 | 6/1972 | Lindsay et al. | 377/39 |
| 3,878,370 | 4/1975 | Santomango et al. | 377/39 |
| 4,330,751 | 5/1982 | Swain | 328/61 |

Primary Examiner—John S. Heyman
Attorney, Agent, or Firm—Howard G. Massung; Robert A. Walsh

[57] ABSTRACT

Frequency counter-locked-loop apparatus for controlling digitally programmable oscillators includes an arrangement for locking the output frequency of the oscillator to an accurate frequency reference. Frequency, reference and delay registers, a counter and a comparator are configured in a feedback path from the output of the oscillator to its input for continuous control of the output frequency.

11 Claims, 1 Drawing Sheet

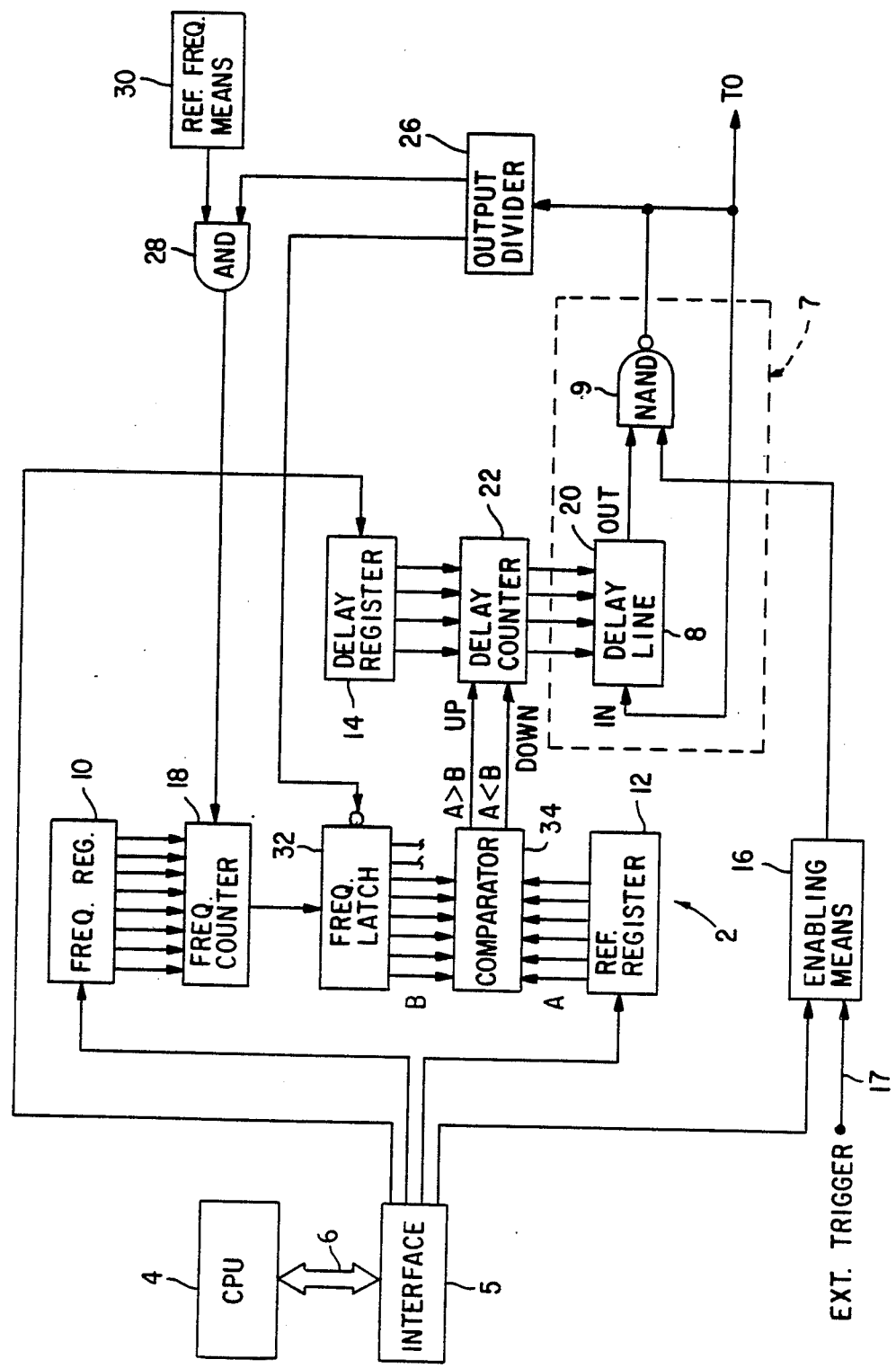

FREQUENCY COUNTER-LOCKED-LOOP APPARATUS FOR CONTROLLING DIGITALLY PROGRAMMABLE OSCILLATORS

BACKGROUND OF THE INVENTION

Programmable oscillators of the type requiring digital inputs for providing frequency outputs such as, for example, delay line oscillators, are usually of the free-running type, with no capability for continuous locking to an external clock source. On the other hand, programmable oscillators having such a capability require an analog voltage input for frequency control.

The presently disclosed invention has the capability of providing continuous frequency control for digitally programmable oscillators through an arrangement including an accurate frequency reference, registers, a counter and a comparator. The arrangement is configured as an integral feedback path from the output of the digitally programmable oscillator to its input for providing the aforenoted frequency control via a counter-locked-loop.

SUMMARY OF THE INVENTION

This invention contemplates apparatus of the type described which controls the output frequency of a digitally programmable oscillator by locking said output frequency to an accurate frequency reference. The frequency locking is accomplished via an arrangement of registers, a counter and a comparator for providing a locked controlling loop. The controlling loop is an integral feedback path from the output of the oscillator to its programmed input, whereby continuous control of the output frequency is achieved.

BRIEF DESCRIPTION OF THE DRAWING

The single figure in the drawing is a block diagram illustrating the invention.

DETAILED DESCRIPTION OF THE INVENTION

The controlling apparatus of the invention is designated by the numeral 2. A central processing unit (CPU) 4 communicates with an interface 5 via an input/output bus 6. A digitally programmable oscillator controlled by controlling apparatus 2 is designated by the numeral 7 and includes a delay line 8 and a NAND gate 9.

Interface 5 provides digital outputs for loading a frequency register 10, a reference register 12, and a delay register 14. Interface 5 provides a digital output for triggering an enabling means 16. Enabling means 16 may also be triggered by an external trigger as at 17.

While CPU 4 and interface 5 are described as loading registers 10, 12 and 14 and providing an output for triggering enabling means 16, it will be understood that the same can be accomplished by hardware such as switches or jumpers as will be readily understood by those skilled in the art.

Frequency register 10 is loaded with one-half of the least significant bits of a frequency counter 18 to provide rounding rather than truncating of the result. With reference to the Figure, the six most significant bits of eight bit frequency counter 10 are used. The two unused least significant bits are weighted as four so that frequency register 10 is loaded with four divided by two, or two bits. The unused bits filter a + or − one bit error inherent in counter 18.

Reference register 12 is loaded with an ideal count i.e., the count expected at the output of frequency counter 18 at the end of a sampling period whenever that output frequency is at a desired accuracy.

Delay register 14 is loaded with a delay unit value i.e., the number which, according to manufacturers specifications, will deliver the desired frequency. This delay unit value is transferred to delay line 8 of oscillator 7 via a counter 22.

Triggering is accomplished when enabling means 16 is triggered to provide a logic "high" output. This output is applied to NAND gate 9 in oscillator 7 as is the output (OUT) of delay line 8. NAND gate 9 outputs a first pulse synchronously with the aforenoted triggering. This pulse is fed back to the input (IN) of delay line 8 for inversion after a programmed delay period which is stored in delay register 14. Each inversion constitutes one-half of an output period. The output lasts as long as the output from enabling means 16 is at a logic "high". If edge triggering is desired, this output can be latched as is well known in the art and not otherwise shown or described.

Frequency control is accomplished when the output of oscillator 7 is applied to an output divider 26. An output from divider 26 enables an AND gate 28 which receives pulses from a highly accurate reference frequency means 30. In this connection it will be understood that reference frequency means 30 may be a conventional crystal or the like as is well known in the art.

Thus, divider 26 enables gate 28 for a duration of M output cycles. At the end of this time the divider enables a frequency latch 32 via another output.

Frequency counter 18 counts the pulses from continuously running reference frequency means 30 as long as gate 28 is enabled. When gate 28 is finally disabled, frequency latch 32 contains a count Cf, as follows:

$$Cf = (Fr \cdot To \cdot M) + Ci,$$

where $Cf$ = the count in frequency latch 32 (the final count of frequency counter 18);

$Fr$ = the frequency of the pulses from reference frequency means 30;

$To$ = the output period of oscillator 7;

$M$ = the dividing ratio of divider 26; and $Ci$ = the contents of frequency register 10 (the initial count of frequency counter 18).

A comparator 34 compares the ideal count (A) in reference register 12 with the count (B = Cf/4) in frequency latch 32. If the count (A) in reference register 12 is less than the count (B) in frequency register 32, delay counter 22 is decremented (down) by the comparator and if the count in reference register 12 is greater than the count in frequency register 32, delay counter 22 is incremented (up).

The aforenoted sequence repeats automatically every (To·M) period, until count (Cf) is equal to the ideal count, and then the oscillator output period (To) is considered locked. Hence, a counter-locked-loop is provided which functions as a monitor against an unprogrammed shift in the output period. The average output frequency from oscillator 7 is equal to a multiple of the reference frequency from reference frequency means 30.

OPERATION OF THE INVENTION

The operation of the invention can best be illustrated by numerical examples. Thus, consider the following:

(a) A 4-bit programmable oscillator 7 has an inherent period of 4.0 nanoseconds (N sec) and period steps of 0.2 nanoseconds per bit. In this example, to achieve, for example, an output period of 5.4 nanoseconds, delay counter 22 is set to an output period value of "7" by delay register 14.

(b) A 9-bit divider 26 effectively multiplies the output period To of oscillator 7, by 500.

(c) An accurate frequency reference means 30 provides a frequency, Fr, of 40.0 MHz (a period, Tr, of 25.0 nanoseconds).

(d) A frequency counter 18 has 8 bits, the 6 most significant of which (B=Cf/4) are fed to comparator 34 via latch 32. The 2 least significant bits are set, by frequency register 10, to the value "2", which provides rounding rather than truncating of the result as aforenoted.

(e) A 6-bit reference register 12 is loaded with the value A=27, which is the calculated "ideal count" if oscillator 7 were absolutely accurate:

$$A = (Fr \cdot ideal\ To \cdot M)/4$$

(the division by 4 compensates for the two unused bits of frequency counter 18).

$$A = (40.0\ MHz \cdot 5.4\ N\ sec \cdot 500)/4 = 27$$

Case A

The initial output period is accurate, To = 5.4 N sec.
Cf = (Fr·To·M)+Ci
= (40.0 MHz·5.4 N sec·500)+2=110
B = Cf/4 = 27 (integer division)
Since A=B, delay counter 22 remains unchanged.

Case B

The initial output period is too short, To = 5.2 N sec.
Cf = (Fr·To·M)+Ci
= (40.0 MHz·5.2 N sec·500)+2=106
B = Cf/4 = 26 (integer division).
Since B is less than A, delay counter 22 is incremented from 7 to 8, which results in an addition of 0.2 N sec to the period commensurate with the oscillator characteristics. The new output period is accurate, 5.4 N sec, which results in B=27, as in Case A, and the new, accurate frequency remains "locked".

Case C

The initial output period is too long, To=5.6 N sec.
Cf = (Fr·To·M)+Ci
= (40.0 MHz·5.6 N sec·500)+2=114
B = Cf/4 = 28 (integer division).
Since B is greater than A, delay counter 22 is decremented from 7 to 6, which results in a subtraction of 0.2 N sec from the period, commensurate with the oscillator characteristics. The new output period is accurate, 5.4 N sec, which results in B=27, as in Case A, and the new, accurate frequency remains "locked".

With reference to the above, it will be understood that if the actual output frequency is not an integer multiple of the programmable bit increments (in the example above, 0.2 nanoseconds per bit), the output frequency will alternate between the two closest possible frequencies below and above the accurate frequency, thus making the average output frequency accurate.

It will be understood that the components of the invention referred to herein are commercially available components and no further description thereof is considered necessary for an understanding of the invention. Moreover, the novelty of the invention resides in the arrangement of these components and not in the components themselves.

With the above description of the invention in mind reference is made to the claims appended hereto for a definition of the scope of the invention.

What is claimed is:

1. Frequency counter-locked-loop apparatus for controlling a digitally programmable oscillator of the type including delay means and gate means for providing the oscillator output, comprising:

first register means loaded with a digital count corresponding to a predetermined frequency;

second register means loaded with an ideal digital count;

third register means loaded with a digital count corresponding to a predetermined delay;

the oscillator delay means connected to the third register means and responsive to the digital count loaded therein for providing a delay output;

means for providing a triggering output;

the oscillator gate means connected to the oscillator delay means and to the triggering output means and responsive to the outputs therefrom for providing the oscillator output synchronous with the triggering output;

the oscillator gate means connected to the oscillator delay means in feedback relation for feeding back the oscillator output to the delay means whereby a programmable oscillator output is provided;

divider means connected to the oscillator gate means for dividing the oscillator output and for providing a first enabling output for a predetermined duration and thereafter providing a second enabling output;

means for providing pulses at a reference frequency;

other gate means connected to the divider means and to the reference frequency means and responsive to the first enabling output and the reference frequency pulses for providing output pulses for a predetermined number of oscillator output cycles;

the first register means connected to the other gate means and to the divider means for counting the output pulses from the other gate means, and responsive to the second enabling output from the divider means for providing a digital count;

comparator means connected to the first register means and the second register means for comparing the respective digital counts; and the comparator means connected to the third register means for incrementing the third register means when the second register means digital count is greater than the first register means digital count, and for decrementing the third register means when the first register means digital count is greater than the second reference means digital count.

2. Apparatus as described by claim 1, wherein the first register means includes: a register loaded with the digital count corresponding to a predetermined frequency, a counter connected to the register for reviewing the digital count loaded therein and connected to the other gate means for counting the output pulses therefrom, and a latch connected to the counter and to the divider means and responsive to the second enabling output from the divider means for latching the output pulse count; and the comparator means being connected to the latch and to the second register means for comparing the respective digital counts.

3. Apparatus as described by claim 1, wherein the third register means includes: a register loaded with the count corresponding to the predetermined delay, and a delay count counter connected to the register loaded with the predetermined delay count for counting the digital delay count loaded therein; and the oscillator delay means being connected to the delay count counter for receiving the digital count therefrom and the comparator being connected to the delay count counter for incrementing and decrementing the delay count counter.

4. Apparatus as described by claim 2, wherein:

the latched output pulse count is a final digital count provided by the counter and is equal to the product of the frequency of the pulses from the reference frequency means, the period of the oscillator output and the dividing ratio of the divider means, plus the count loaded in the register which is loaded with a digital count corresponding to a predetermined frequency.

5. Apparatus as described by claim 2, wherein:

the register which is loaded with a digital count corresponding to a predetermined frequency is loaded with a count which corresponds to one-half of the least significant bits of the counter connected to said register.

6. Frequency counter-locked-loop apparatus for controlling the output frequency of a programmable oscillator of the type including delay means and gate means for providing the oscillator output, comprising:

first register means loaded with a digital count corresponding to a predetermined delay;

the oscillator delay means connected to the first register means and responsive to the digital count loaded therein for providing a delay output;

means for providing a triggering output;

the oscillator gate means connected to the oscillator delay means and to the triggering output means and triggered by the triggering output for providing the oscillator output in response to the delay output synchronous with the triggering output;

the oscillator gate means connected to the oscillator delay means in feedback relation for feeding back the oscillator output to the delay means, whereby a programmable oscillator output is provided; and divider means connected to the oscillator gate means for dividing the oscillator output and for providing a first enabling output for a predetermined duration and thereafter providing a second enabling output.

7. Apparatus as described by claim 6, including:

second register means loaded with a digital count corresponding to a predetermined frequency;

third register means loaded with an ideal digital count;

means for providing pulses at a reference frequency;

other gate means connected to the divider means and to the reference frequency means and responsive to the first enabling output and the reference frequency pulses for providing output pulses for a predetermined number of oscillator output cycles;

the second register means connected to the other gate means and to the divider means for counting the output pulses from the other gate means, and responsive to the second enabling output from the divider means for providing a digital count;

comparator means connected to the second register means and to the third register means for comparing the respective digital counts; and the comparator means connected to the first register means for incrementing said first register means when the third register means digital count is less than the second register means digital count, and for decrementing the first register means when the third register means digital count is greater than the second reference means digital count.

8. Apparatus as described by claim 7, wherein the second register means includes: a register loaded with the digital count corresponding to a predetermined frequency, a counter connected to the register for reviewing the digital count loaded therein and connected to the other gate means for counting the output pulses therefrom, and a latch connected to the counter and to the divider means and responsive to the second enabling output from the divider means for latching the output pulse count; and the comparator means being connected to the latch and to the third register means for comparing the respective digital counts.

9. Apparatus as described by claim 7, wherein the first register means includes: a register loaded with the count corresponding to the predetermined delay, and a delay count counter connected to the register loaded with the predetermined delay count for counting the digital delay count loaded therein; and the oscillator delay means being connected to the delay count counter for receiving the digital count therefrom and the comparator being connected to the delay count counter for incrementing and decrementing the delay count counter.

10. Apparatus as described by claim 7, wherein:

the latched output pulse count is a final digital count provided by the counter and is equal to the product of the frequency of the pulses from the reference frequency means, the period of the oscillator output and the dividing ratio of the divider means, plus the count loaded in the register which is loaded with a digital count corresponding to a predetermined frequency.

11. Apparatus as described by claim 7, wherein:

the register which is loaded with a digital count corresponding to a predetermined frequency is loaded with a count which corresponds to one-half of the least significant bits of the counter connected to said register.

* * * * *